United States Patent
Kawahara et al.

(10) Patent No.: US 6,235,649 B1
(45) Date of Patent: May 22, 2001

(54) METHOD OF FORMING HIGH DIELECTRIC CONSTANT THIN FILM AND METHOD OF MANUFACTURING SEMICONDUCTOR DEVICE

(75) Inventors: Takaaki Kawahara; Mikio Yamamuka; Tsuyoshi Horikawa; Masayoshi Tarutani; Takehiko Sato; Shigeru Matsuno, all of Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/444,297

(22) Filed: Nov. 22, 1999

(30) Foreign Application Priority Data

Jun. 14, 1999 (JP) .................................. 11-166205

(51) Int. Cl.[7] .................. H01L 21/316; H01L 21/283; B05D 1/36; C23C 16/40
(52) U.S. Cl. ............... 438/785; 438/761; 438/763; 438/778; 427/126.3; 427/255.395; 427/255.28; 427/255.32; 427/255.36; 427/404; 427/419.2
(58) Field of Search ............... 427/126.3, 255.28, 427/255.395, 255.36, 255.32, 404, 419.2; 438/785, 778, 761, 763

(56) References Cited

U.S. PATENT DOCUMENTS

| | | | |
|---|---|---|---|
| 5,527,567 | * | 6/1996 | Desu et al. ...................... 427/573 |
| 5,555,154 | | 9/1996 | Uchikawa et al. . |
| 5,767,302 | * | 6/1998 | Ogi et al. ...................... 556/54 |
| 5,776,254 | | 7/1998 | Yuuki et al. . |
| 5,929,475 | * | 7/1999 | Uemoto et al. ................ 257/295 |
| 6,010,744 | * | 1/2000 | Buskirk et al. .................. 427/81 |
| 6,025,222 | * | 2/2000 | Kimura et al. ................. 438/240 |
| 6,110,529 | * | 8/2000 | Gardiner et al. ................ 427/250 |

FOREIGN PATENT DOCUMENTS

| | | |
|---|---|---|
| 5-299365 | 11/1993 | (JP) . |
| 6-310444 | 11/1994 | (JP) . |
| 7-94426 | 4/1995 | (JP) . |
| 9-219497 | 8/1997 | (JP) . |

OTHER PUBLICATIONS

Kawahara et al., "Step Coverage and Electrical Properties of (Ba, Sr)TiO3 Films Prepared by Liquid Source Chemical Vapor Deposition Using TiO(DPM)2", Japanese Journal of Applied Physics, vol. 33, part 1, No. 9B, pp. 5129–5134, Sep. 1994.*

"Step Coverage and Electrical Properties of (Ba, Sr) $TiO_3$ Films Prepared by Liquid Source Chemical Vapor Deposition Using $TiO(DPM)_2$", by Kawahara et al., Japanese Journal of Applied Physics, vol. 33, Part 1, No. 9B, Sep. 1994, pp. 5129–5134.

"Dielectric Thin Film Materials", by Ogi et al., Collected Papers for Lectures in the "Fifty–First Symposium of Semi-conductor and Integrated Circuit Technology", Dec. 12–13, 1996, pp. 60–65.

* cited by examiner

Primary Examiner—Katherine A. Bareford
Assistant Examiner—Michael Barr
(74) Attorney, Agent, or Firm—McDermott, Will & Emery

(57) ABSTRACT

A method of forming a (Ba, Sr) $TiO_3$ high dielectric constant thin film with sufficient coverage is provided. A Ba material, an Sr material and a Ti material including bis (t-butoxy) bis (dipivaloylmethanate) titanium are dissolved in an organic solvent to obtain a solution material. The solution material is vaporized, so that material gas is obtained. A (Ba, Sr) $TiO_3$ thin film is formed on a substrate by CVD reaction using the material gas.

8 Claims, 4 Drawing Sheets

METHOD OF FORMING HIGH DIELECTRIC CONSTANT THIN FILM AND METHOD OF MANUFACTURING SEMICONDUCTOR DEVICE

BACKGROUND OF THE INVENTION

1. Field of the Invention

The present invention generally relates to methods of forming high dielectric constant thin films, and more specifically to a method of forming a high-dielectric constant thin film used for a semiconductor memory or the like. The present invention also relates to a method of manufacturing a semiconductor device provided with such high dielectric constant thin film.

2. Description of the Background Art

Recently, semiconductor memories or devices have been increasingly reduced in size. In a dynamic random access memory (a DRAM), for example, the number of bits has quadrupled in three years. Such rapid reduction in size is intended for high integration degree of the device, reduction in power consumption and cost, or the like. However, even if the integration degree increases, a capacitor of the DRAM must be provided with a prescribed capacitance. Therefore, a thickness of a film of a capacitor material must be reduced. With $SiO_2$ which has conventionally been used, it is difficult to reduce the thickness of the film. If the material provided with higher dielectric constant is employed, a sufficient capacitance would be ensured as in the case of the reduction in the thickness of the film. Thus, many studies have been done for utilizing a high dielectric constant material for the memory device.

The most important requirement for the capacitor material is that it is a thin film having the above mentioned high dielectric constant and small leakage current. Namely, as long as the high dielectric constant material is used, a thickness of the film must be as small as possible and the leakage current must be a minimum value. Generally, it is preferable that the thickness of the film is at most 0.5 nm of an equivalent $SiO_2$ thickness and a leakage current density when 1 V is applied is at most $2\times10^{-7} A/cm^2$. In the case of the thin film formed on an electrode for a capacitor of the DRAM having a step portion, the film must be formed by CVD (Chemical Vapor Deposition) providing high conformity even in the case of a complicated shape. However, there is no such material for CVD that has stable and sufficient vaporization property. This is because a β-diketone type dipivaloylmethanate (hereinafter abbreviated as DPM) compound, which is often used as the material for CVD, is not provided with sufficient vaporization property by heating.

In this context, the present inventor has found that the effect of the vaporization property dramatically increases when a conventional solid material is dissolved in an organic solvent of tetrahydrofuran (hereinafter abbreviated as THF), and proposed that the material should be used for CVD (Japanese Patent Laying-Open No.5-299365). However, it has been found that a good result cannot necessarily be obtained even when the material is used for formation of a dielectric film using a CVD apparatus for a liquid material which has conventionally been used for forming an $SiO_2$ film. Then, the present inventor has developed a CVD apparatus for a liquid material capable of sufficiently vaporizing the liquid material and stably supplying it for a reaction chamber (Japanese Patent Laying-Open No. 6-310444 and No. 7-94426). However, even when the dielectric film is formed by the CVD apparatus for vaporizing the solution, stable and sufficient film property (including electrical property) is not necessarily obtained.

FIG. 5 is a schematic illustration showing a CVD apparatus for forming a high dielectric constant thin film which has been disclosed in Japanese Patent Laying-Open No. 9-219497.

Referring to FIG. 5, a solution 14 in which a solid of Ba $(DPM)_2$ is dissolved in a solvent of THF (the solution is hereinafter abbreviated as Ba $(DPM)_2$/THF), Sr $(DPM)_2$/THF 15 and Ti $(t-BuO)_2$ $(DPM)_2$/THF 16 are fed to a vaporizer 23 through liquid mass flow controllers 19 and air valves 22. THF 17 is fed to vaporizer 23 through liquid mass flow controllers 19 and air valves 21. $N_2$ carrier gas 18 is fed to vaporizer 23 through gas flow controller 20 and air valve 21. Vaporizer 23 is provided above a reaction chamber 32. A susceptor 30 with a heater 31 is provided in reaction chamber 32. A substrate 29 is placed on susceptor 30. A gas nozzle 28 is provided on a ceiling of reaction chamber 32. The material gas which has been fed to vaporizer 23 is mixed with $O_2$ gas 33 in a mixer 27, and supplied for reaction chamber 32 through gas nozzle 28. A vent is denoted by a reference numeral 26, and air valves on the sides of vent and reaction chamber are respectively denoted by 24 and 25. A pressure controller 34 is provided below reaction chamber 32.

Now, a method of manufacturing a high dielectric constant thin film using a conventional CVD apparatus for forming the high dielectric constant thin film will be described.

Referring to FIG. 5, a mixture of Ba $(DPM)_2$/THF 14, Sr $(DPM)2THF$ 15, Ti $(t-BuO)_2(DPM)_2$/THF 16, THF 17 and $N_2$ carrier gas 18 are fed to vent 26 from vaporizer 23, so that a flow of the mixture of the gas and liquid is obtained. $O_2$ gas 33 is supplied for reaction chamber 32 and pressure controller 34 is adjusted, so that a pressure in reaction chamber 32 is set at a desired level (for example at 5 Torr). Air valve for vent 24 is closed and, at the same time, air valve for reaction chamber 25 is opened. Thus, the mixture of gas and liquid is supplied for reaction chamber 32, and a film of $(Ba, Sr) TiO_3$ (hereinafter abbreviated as a BST thin film) of Stoichiometric is formed on substrate 29.

FIG. 6 is a cross sectional view showing a semiconductor device thus formed. Referring to FIG. 6, a poly-Si plug 4 is formed in a silicon substrate 2. A barrier metal 3 is formed on poly-Si plug 4. An Ru storage node 1 is formed on barrier metal 3. A BST thin film 35 including TiO $(DPM)_2$ is formed to cover Ru storage node 1. When thicknesses 6 and 7 of BST thin film 35 formed on Ru storage node 1 are respectively $d_{max}$ and $d_{min}$, a distance 8 between adjacent Ru storage nodes 1, 1 is W (~0.13 μm) and a height 9 of Ru storage node 1 is D (~0.36 μm), a coverage $d_{min}/d_{max}$ is at most 50% for an aspect ratio D/W (at least 3).

The conventional method of manufacturing the high dielectric constant thin film has been performed as described above.

However, in the case of the DRAM of 4-Gbit class or the like, aspect ratio D/W is at least 3 for the semiconductor device having a step portion as shown in FIG. 6. Even on the step portion, a conformal coverage (at least 80%) must be ensured. However, when TiO $(DPM)_2$ is used as a Ti material, the coverage is at most about 50% for aspect ratio D/W of at least 3, whereby sufficient coverage is not obtained. As a result, it is difficult to form an upper electrode (a cell plate) on the BST thin film.

SUMMARY OF THE INVENTION

The present invention is made to solve the aforementioned problem. An object of the present invention is to provide a method of manufacturing a high dielectric constant thin film ensuring sufficient coverage.

Another object of the present invention is to provide a method of forming a high dielectric constant thin film which has been improved to ensure a sufficient capacitance as in the case of a reduction in a thickness of the film.

Another object of the present invention is to provide a method of forming a high dielectric constant thin film which has been improved to reduce a material used and a cost.

Another object of the present invention is to provide a method of forming a high dielectric constant thin film which has been improved to make the formation of the high dielectric constant thin film considerably stable for a long period of time.

Still another object of the present invention is to provide a method of manufacturing a semiconductor device provided with a high dielectric constant BST thin film having a conformal coverage.

In a method of forming a high dielectric constant thin film according to a first aspect of the present invention, first, a Ba material including a dipivaloylmethanate type organic barium compound, an Sr material including a dipivaloylmethanate type organic strontium compound and a Ti material including a bis (t-butoxy) bis (dipivaloylmethanate) titanium $Ti(t-BuO)_2$ $(DPM)_2$ compound are dissolved in an organic solvent, so that a solution material is obtained. The solution material is vaporized, so that material gas is obtained. A $(Ba, Sr) TiO_3$ thin film is formed on a substrate by CVD reaction using the above mentioned material gas.

According to the present invention, as the Ti material including $Ti(t-BuO)_2$ $(DPM)_2$ is used, it becomes unlikely that molecules adhere to the substrate as compared with the case where the conventional $TiO (DPM)_2$ is used, so that sufficient coverage is ensured.

In a method of forming a high dielectric constant thin film according to a second aspect of the present invention, the above mentioned Ti material includes bis (t-butoxyl) bis (dipivaloylmethanate) titanium mixed with another Ti-β-diketone complex.

According to the present invention, as another Ti-β-diketone complex is mixed, a film formation speed is increased and a material used and a cost are reduced.

According to a third aspect of the present invention, the above mentioned another Ti-β-diketone complex is Ti (OH) (t-BuO) $(DPM)_2$ derived from Ti $(t-BuO)_2$ $(DPM)_2$.

According to the present invention, if the proportion of Ti (OH) (t-BuO) $(DPM)_2$ in the mixture is increased, a film formation speed is increased and a material used is reduced.

According to a fourth aspect of the present invention, the above mentioned another Ti-β-diketone complex is oxo-bis (dipivaloylmethanate) titanium.

The use of oxo-bis (dipivaloylmethanate) titanium also enables increase in a film formation speed and reduction in the material used.

In a method of forming a high dielectric constant thin film according to a fifth aspect of the present invention, the above mentioned another Ti-β-diketone complex is bis (isopropoxy) bis (dipivaloylmethanate) titanium.

According to the present invention, if the proportion of bis (isopropoxy) bis (dipivaloylmethanate) titanium is increased, increase in a film formation speed and reduction in a material used can be achieved.

In a method of forming a high dielectric constant thin film according to a sixth aspect of the present invention, first, a Ba material including a dipivaloylmethanate type organic barium compound, an Sr material including a dipivaloylmethanate type organic strontium compound and a Ti material including a dipivaloylmethanate type organic titanium compound are dissolved in tetrahydrofuran, so that a solution material is obtained.

Antioxidant is added to the solution material. The solution material is vaporized, so that material gas is obtained. A $(Ba, Sr) TiO_3$ thin film is formed on a substrate by CVD reaction using the material gas.

According to the present invention, as the antioxidant is added to the solution material, oxidation of a solvent of THF is prevented, whereby formation of the high dielectric constant film remains considerably stable for a long period of time.

In a method of forming a high dielectric constant thin film according to a seventh aspect of the present invention, butylhydroxytoluene is used as antioxidant. The use of butylhydroxytoluene prevents oxidation of the solvent of THF.

In a method of forming a high dielectric constant thin film according to an eighth aspect of the present invention, phenol is used as antioxidant. If phenol is added to a solution material, oxidation of the solvent of THF is prevented.

In a method of forming a high dielectric constant thin film according to a ninth aspect of the present invention, a Ba material including a dipivaloylmethanate type organic barium compound, an Sr material including a dipivaloylmethanate type organic strontium compound and a Ti material including a dipivaloylmethanate type organic titanium compound are dissolved in tetrahydrofuran, so that a solution material is obtained. A moisture content in the solution material is reduced. The material solution is vaporized, so that material gas is obtained. A $(Ba, Sr) TiO_3$ thin film is formed on a substrate by CVD reaction using the material gas.

According to the present invention, as the solution material with reduced moisture content is used, a pressure in the vaporizer is stabilized over a long period of time and formation of the high dielectric constant thin film remains considerably stable for a long period of time.

In a method of forming a high dielectric constant thin film according to a tenth aspect of the present invention, a moisture content of the solution material is at most 100 ppm.

According to the present invention, as the solution material with the moisture content of at most 100 ppm is used, a pressure in the vaporizer is stabilized for a long period of time, so that formation of high dielectric constant thin film remains stable for a long period of time.

In a method of manufacturing a semiconductor device according to an eleventh aspect of the present invention, a first electrode layer is formed on a semiconductor substrate. A dielectric layer is formed on the first electrode layer. A second electrode layer is formed on the first electrode layer with the dielectric layer interposed. In a step of forming the dielectric layer, first, a Ba material including a dipivaloylmethanate type organic barium compound, an Sr material including a dipivaloylmethanate type organic strontium compound and a Ti material including bis (t-butoxy) bis (dipivaloylmethanate) titanium Ti $(t-BuO)_2$ $(DPM)_2$ are dissolved in an organic solvent, so that a solution material is obtained. The solution material is vaporized, so that material gas is obtained. A $(Ba, Sr) TiO_3$ thin film is formed on a semiconductor substrate by CVD reaction using the material gas.

According to the present invention, as Ti $(t-BuO)_2$ $(DPM)_2$ is used, it becomes unlikely that molecules adhere to the substrate, so that the semiconductor device provided with the high dielectric constant thin film having sufficient coverage is provided.

In a method of manufacturing a semiconductor device according to a twelfth aspect of the present invention, the above mentioned Ti material includes bis (t-butoxy) bis (dipivaloylmethanate) titanium mixed with another Ti-β-diketone complex.

According to the present invention, if the proportion of another Ti-β-diketone complex is increased, increase in a film formation speed and reduction in a material used can be achieved.

In a method of manufacturing a semiconductor device according to a thirteenth aspect of the present invention, the above mentioned another Ti-β-diketone complex is Ti (OH) (t-BuO) (DPM)$_2$ derived from Ti (t-BuO)$_2$ (DPM)$_2$.

As the β-diketone complex is mixed, increase in a film formation speed and reduction in a material used and cost can be achieved.

In a method of manufacturing a semiconductor device according to a fourteenth aspect of the present invention, the above mentioned another Ti-β-diketone complex is oxo-bis (dipivaloylmethanate) titanium.

The use of such another Ti-β-diketone complex also enables increase in a film formation speed and reduction in a material used and cost.

In a method of manufacturing a semiconductor device according to a fifteenth aspect of the present invention, the above mentioned another Ti-β-diketone complex is bis (isopropoxy) bis (dipivaloylmethanate) titanium. The use of another Ti-β-diketone complex also enables increase in a film formation speed and reduction in a material used and cost.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

In a method of forming a high dielectric constant thin film by CVD according to the present invention, Ti (t-BuO)$_2$ (DPM)$_2$ or a mixture of Ti solid material including Ti (t-BuO)$_2$ (DPM)$_2$ with another Ti-β-diketone is used as a Ti material. Thus, for example, for an aspect ratio required for 4-Gbit class (D/W is at least 3, as will later be described), conformal coverage of about 80% is ensured. In addition, an upper electrode (a cell plate) can readily be formed on a BST thin film, thereby satisfying a specification for 4-Gbit class. The method will now be described with reference to the drawings.

First Embodiment

Figure 1:
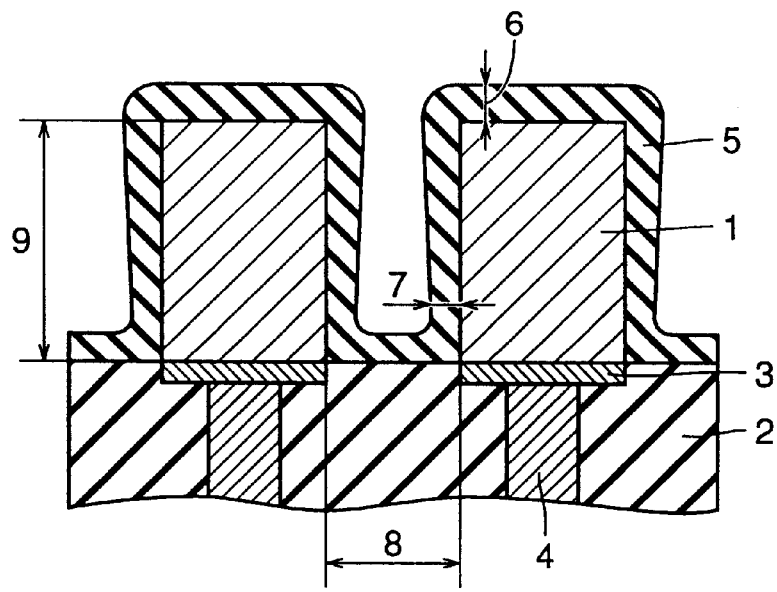
FIG. 1 is a cross sectional view showing a semiconductor device including a high dielectric constant thin film formed by a method of forming the high dielectric constant thin film according to a first embodiment.

FIG. 1 is a cross sectional view showing a semiconductor device formed by a method of forming a high dielectric constant thin film according to a first embodiment. Unlike the conventional case where TiO (DPM)$_2$ is used, a BST thin film 5 is formed by CVD using Ti (t-BuO)$_2$ (DPM)$_2$ which prevents molecules from adhering to a substrate and provides sufficient coverage. The high dielectric constant thin film is formed on a cell structure of a DRAM for 4-Gbit scale.

Referring to FIG. 1, a poly-Si plug 4 is formed in a silicon substrate 2. An Ru storage node 1 is connected to polySi plug4 with a barrier metal 3 interposed. High dielectric constant BST thin film 5 is formed to cover Ru storage node 1 using Ti (t-BuO)$_2$ (DPM)$_2$.

A thickness 6 of BST thin film 5 formed on an upper surface of Ru storage node 1 is represented by $d_{max}$. A thickness 7 of BST thin film 5 formed on a sidewall of Ru storage node 1 is represented by $d_{min}$. A distance 8 between adjacent Ru storage nodes is represented by W (~0.13 μm). A height 9 of Ru storage node 1 is represented by D (~0.36 μm). Solid Ti (t-BuO)$_2$ (DPM)$_2$ includes a Ti ion surrounded by four large organic ligands. Therefore, it is unlikely that a precursor for film formation adheres to the substrate. As a result, actually, for aspect ratio D/W (at least 3), the high dielectric constant BST thin film having a conformal coverage of about at least 80% can be formed. Thus, the specification for 4-Gbit class is satisfied. An upper electrode is formed on BST thin film 5 to complete a capacitor.

Second Embodiment

In the present embodiment, as a Ti material, a mixture of Ti (t-BuO)$_2$ (DPM)$_2$ with another Ti-β-diketone complex such as Ti (OH) (t-BuO) (DPM)$_2$ derived from Ti (t-BuO)$_2$ (DPM)$_2$ is used.

Figure 2:
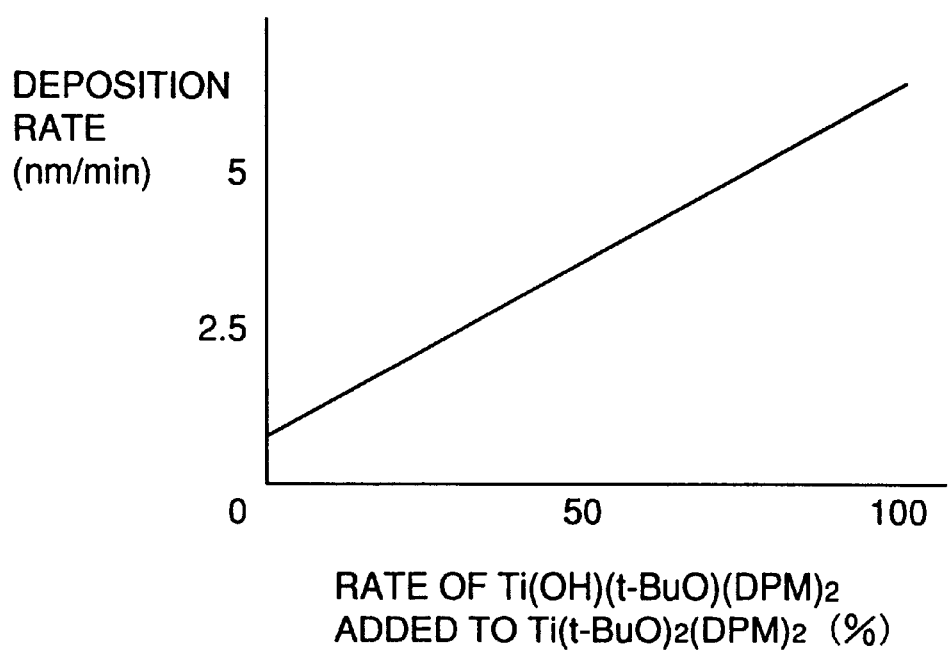
FIG. 2 is a graph showing a relation between the proportion of Ti (OH) (t-BuO) (DPM)$_2$ in a mixture and a film formation speed.

FIG. 2 is a graph showing a relation between the proportion of Ti(OH) (t-BuO) (DPM)$_2$ added to Ti (t-BuO)$_2$ (DPM)$_2$ and a film formation speed. Referring to FIG. 2, if the proportion of Ti (OH) (t-BuO) (DPM)$_2$ is increased, the film formation speed increases. In addition, a material used and a cost can be reduced.

TiO(DPM)$_2$ or Ti (O-iPr)$_2$ (DPM)$_2$ may be used as another Ti-β-diketone complex to be added to Ti (t-BuO)$_2$ (DPM)$_2$ to provide a similar effect.

Third Embodiment

Figure 3:
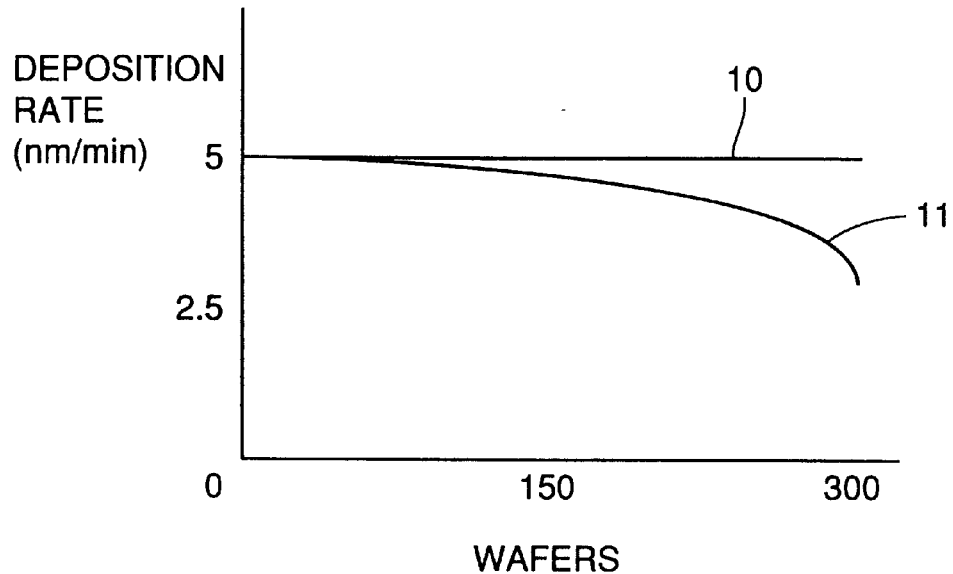
FIG. 3 is a graph showing a relation between the number of wafers processed and the film formation speed.

In the present embodiment, antioxidant is added to a solution material, and a high dielectric constant BST thin film is formed. FIG. 3 is a graph showing a relation between the number of wafers processed and a film formation speed.

In FIG. 3, a straight line 10 represents a change over time in a film formation speed for the high dielectric constant thin film when a solution material to which antioxidant is added is used. A curve 11 represents a change over a time in a film formation speed for the high dielectric constant thin film when a solution material to which antioxidant is not added is used. When antioxidant such as butyl-hydroxytoluene (BHT), phenol or the like is added to the solution material, oxidation of solvent tetrahydrofuran (THF) is prevented. At least 10 ppm of antioxidant is required to provide the effect, and the effect further increases at 100 ppm or higher. As a result, degradation of Ba, Sr and Ti solid materials are prevented.

Deposition conditions are shown in the following Table 1.

TABLE 1

Typical deposition conditions

| | | |
|---|---|---|
| Ba, Sr, Ti | Ba $(DPM)_2$/THF | (0.1 mol/L)0.04 $cm^3$/min |
| | Sr $(DPM)_2$/THF | (0.1 mol/L)0.03 $cm^3$/min |
| | Ti(t-BuO)$_2$ $(DPM)_2$/THF | (0.1 mol/L)0.5 $cm^3$/min |
| | Carrier $N_2$ flow | 200 sccm |
| Oxidant | $O_2$ flow | 1 slm |
| Reactor | Substrate temperature | 420° C. |
| | Pressure | 1.5 Torr |
| Substrate | Ru/Si having line and space structure (Aspect ratio D/W ≧ 3) | |

The antioxidant is added and a BST thin film is formed under the conditions shown in the above Table 1. Even when BST thin films of a thickness of 30 nm are successively formed on 300 wafers, a film formation speed remains constant. On the other hand, when the solution material without antioxidant is used, THF is oxidized and, as a result, Ba, Sr and Ti solid materials are degraded. When BST thin films of a thickness of 30 nm are successively formed on about 300 wafers under the conditions shown in the above Table 1, an amount of residue acceleratingly increases in a vaporizer or in a tube between the vaporizer and a reaction chamber, and the film formation speed gradually decreases. Therefore, when antioxidant such as BHT, phenol or the like is added to the solution material, oxidation of THF is prevented and stability in the film formation of the high dielectric constant thin film can be ensured for a long period of time.

Fourth Embodiment

In the present embodiment, a moisture content of a solution material is reduced to form a high dielectric constant thin film.

Figure 4:
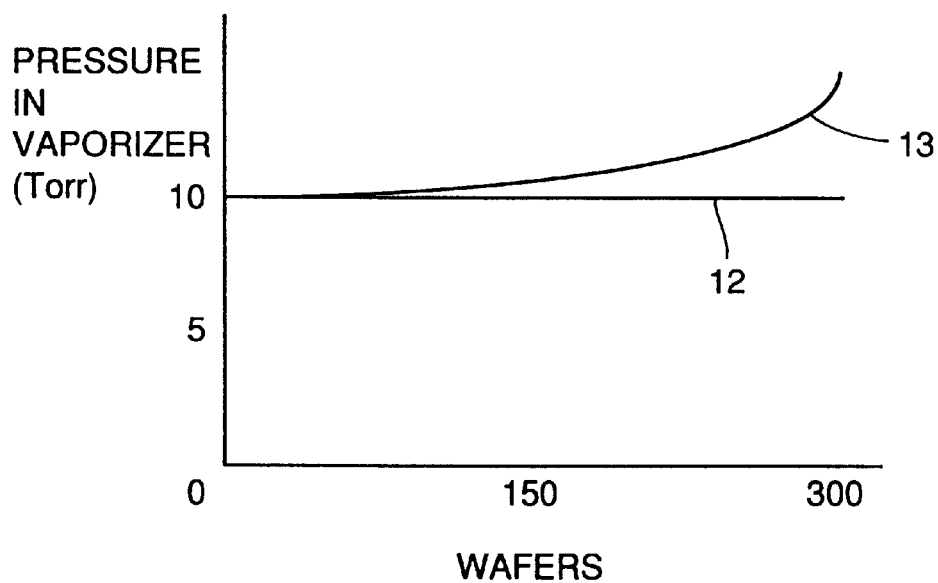
FIG. 4 is a graph showing a relation between the number of wafers processed and a vaporizer pressure.
Figure 5:
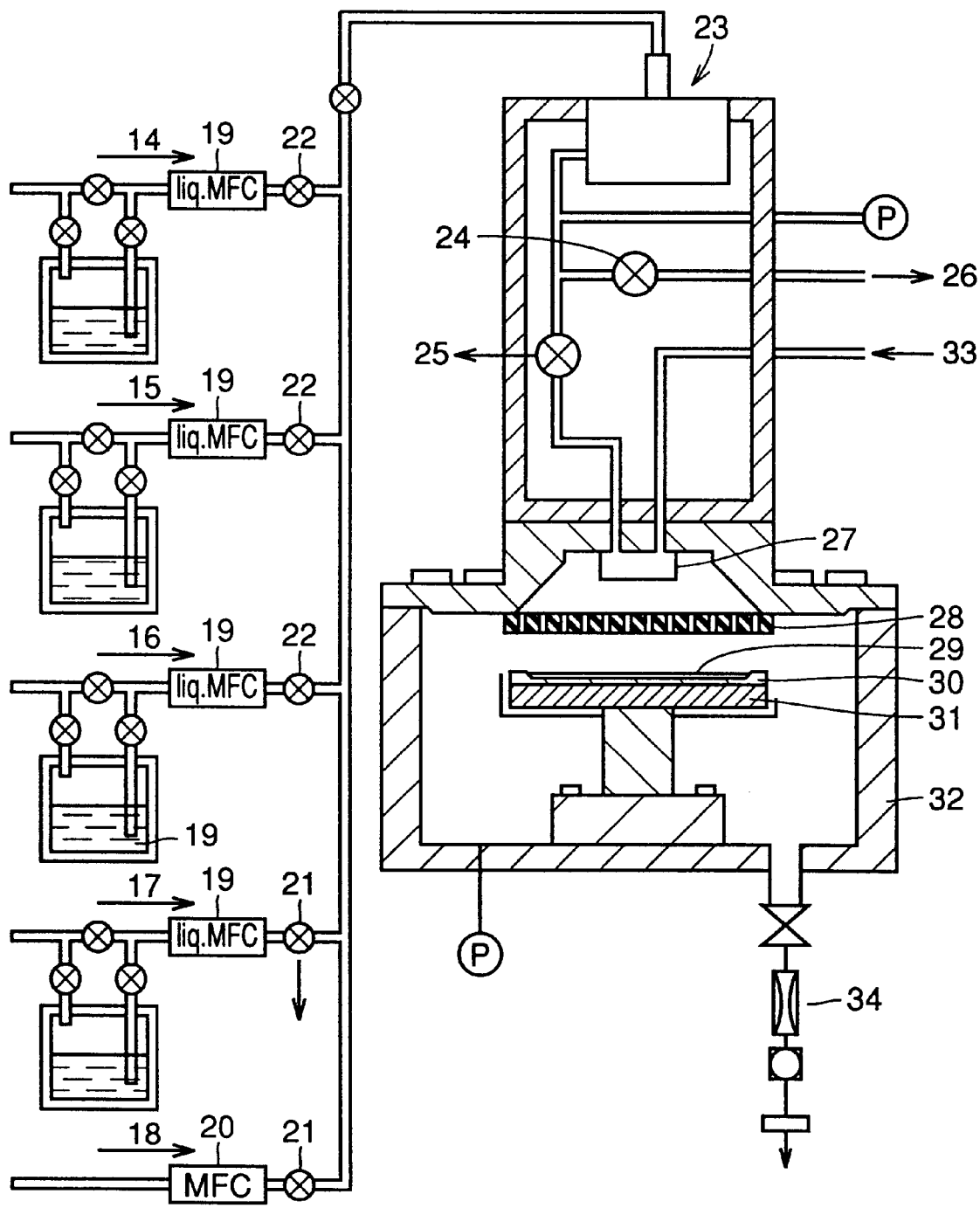
FIG. 5 is a schematic illustration showing a conventional CVD apparatus for forming a high dielectric constant thin film.
Figure 6:
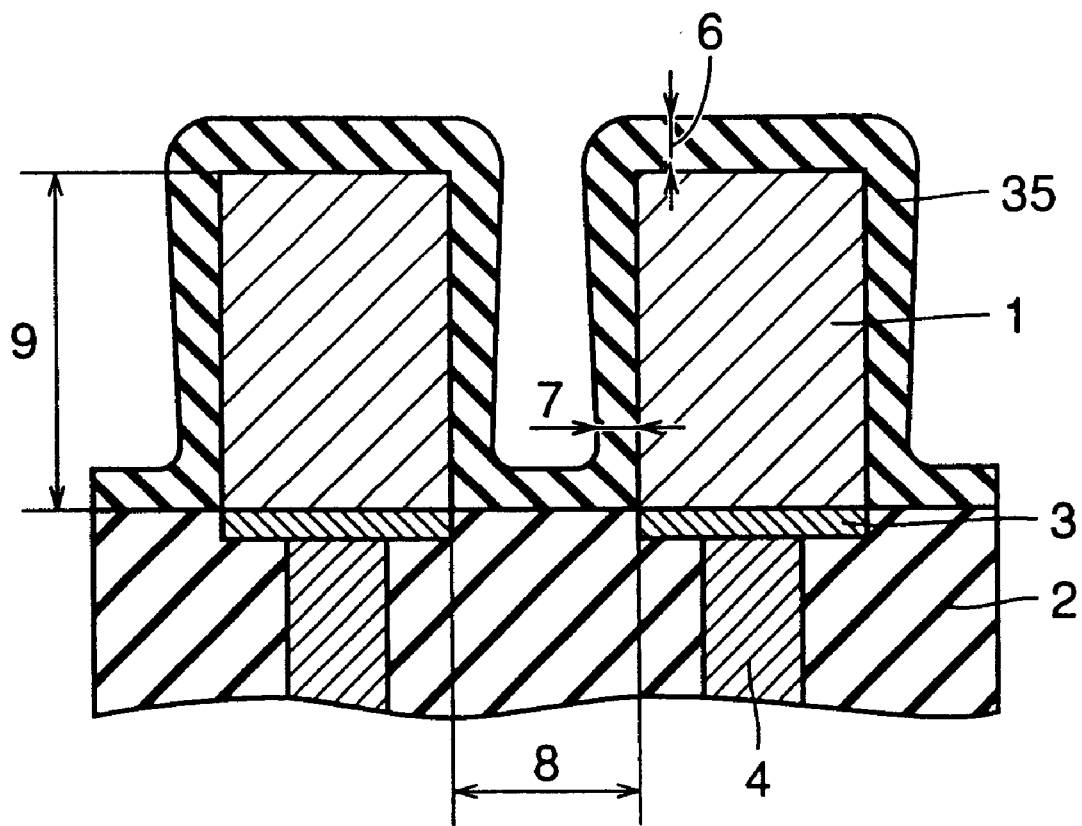
FIG. 6 is a cross sectional view showing a semiconductor device having a high dielectric constant thin film formed by conventional CVD reaction.

FIG. 4 is a graph showing a relation between the number of wafers processed and a pressure in the vaporizer. In FIG. 4, straight line 12 represents a change over time in the pressure in the vaporizer when a solution material having a moisture content of at most 40 ppm is used, whereas a curve 13 shows a relation between the number of wafers processed and the pressure in the vaporizer when a solution material whose moisture content has not been reduced (a solution including a moisture content of at least 100 ppm). When BST thin films having a thickness of 30 nm are successively formed on 300 wafers under the conditions shown in the above Table 1 using the solution material having the moisture content of at most 40 ppm, a change in the pressure in the vaporizer stably remains at about 10 Torr. On the other hand, when the moisture content is not reduced (a solution material having the moisture content of at least 100 ppm is used), if BST thin films of a thickness of 30 nm are successively formed on 100 wafers under the conditions shown in the above Table 1, the pressure in the vaporizer gradually increases. This is because the included moisture degrades Ba, Sr and Ti solid materials, so that sufficient vaporization is not performed. Therefore, a tube between the vaporizer and the reaction chamber, particularly an air valve for reaction chamber 25 (FIG. 5), is closed. With a moisture content of 40 ppm to 100 ppm, a pressure in the vaporizer may increase. To stabilize the pressure in the vaporizer, preferably, the moisture content is kept at most 40 ppm. A film formation speed for the BST thin film when the solution material having a moisture content of at most 40 ppm is used is similar to that when antioxidant is added as shown in FIG. 3, since Ba, Sr and Ti solid materials are not degraded. In addition, a film formation speed when a moisture content is not reduced is similar to that when the antioxidant is not added. Therefore, if the solution material having the moisture content of at most 40 ppm is used, the pressure in the vaporizer is stabilized for a long period of time. Accordingly, film formation of the high dielectric constant thin film can be stabilized for a long period of time.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a high dielectric constant BST thin film having a conformal coverage of about at least 80% for aspect ratio D/W of at least 3, comprising the steps of:
   dissolving a Ba material including a dipivaloylmethanate organic barium compound ($Ba(DPM)_2$), an Sr material including a dipivaloylmethanate organic strontium compound ($Sr(DPM)_2$) and a Ti material including a bis (t-butoxy) bis (dipivaloylmethanate) titanium ($Ti(t-BuO)_2(DPM)_2$) mixed with another Ti-β-diketone complex in an organic solvent to obtain a solution material;
   vaporizing said solution material to obtain material gas; and
   forming a $(Ba,Sr)TiO_3$ thin film on a substrate by CVD reaction using said material gas;
   wherein said Ti material including said bis (t-butoxy) bis (dipivaloylmethanate) titanium is mixed with another Ti-β-diketone complex.

2. The method of forming the high dielectric constant thin film according to claim 1, wherein said another Ti-β-diketone complex is Ti (OH) (t-BuO) $(DPM)_2$ derived from said Ti (t-BuO)$_2$ $(DPM)_2$.

3. The method of forming the high dielectric constant thin film according to claim 1, wherein said another Ti-β-diketone complex is oxo-bis (dipivaloylmethanate) titanium (TiO $(DPM)_2$).

4. The method of forming the high dielectric constant thin film according to claim 1, wherein said another Ti-β-diketone complex is bis (isopropoxy) bis (dipivaloylmethanate) titanium (Ti $(O-iPr)_2$ $(DPM)_2$).

5. A method of manufacturing a semiconductor device having a high dielectric constant BST thin film, said BST thin film having a conformal coverage of about at least 80% for aspect ratio D/W of at least 3, comprising the steps of:

forming a first electrode layer on a semiconductor substrate;

forming a dielectric layer on said first electrode layer; and forming a second electrode layer on said first electrode layer with said dielectric layer interposed, said step of forming said dielectric layer including:

dissolving a Ba material including a dipivaloylmethanate organic barium compound, an Sr material including a dipivaloylmethanate organic strontium compound and a Ti material including bis (t-butoxy) bis (dipivaloylmethanate) titanium (Ti $(t\text{-BuO})_2$ $(DPM)_2$) mixed with another Ti-$\beta$-diketone complex in an organic solvent to obtain a solution material;

vaporizing said solution material to obtain material gas; and forming a (Ba, Sr) $TiO_3$ thin film on a semiconductor substrate by CVD reaction using said material gas.

6. The method of manufacturing the semiconductor device according to claim 5, wherein said another Ti-$\beta$-diketone complex is Ti (OH) (t-BuO) $(DPM)_2$ derived from said Ti $(t\text{-BuO})_2$ $(DPM)_2$.

7. The method of manufacturing the semiconductor device according to claim 5, wherein said another Ti-$\beta$-diketone complex is oxo-bis (dipivaloylmethanate) titanium.

8. The method of manufacturing the semiconductor device according to claim 5, wherein said another Ti-$\beta$-diketone complex is bis (isopropoxy) bis (dipivaloylmethanate) titanium.

* * * * *